(12) United States Patent
Kim

(10) Patent No.: US 12,368,136 B2
(45) Date of Patent: Jul. 22, 2025

(54) SEMICONDUCTOR PACKAGE AND A METHOD OF MANUFACTURING THE SEMICONDUCTOR PACKAGE

(71) Applicant: SAMSUNG ELECTRONICS CO., LTD., Suwon-si (KR)

(72) Inventor: Hyunsu Kim, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 538 days.

(21) Appl. No.: 17/837,260

(22) Filed: Jun. 10, 2022

(65) Prior Publication Data

US 2023/0122804 A1 Apr. 20, 2023

(30) Foreign Application Priority Data

Oct. 14, 2021 (KR) .......................... 10-2021-0136254

(51) Int. Cl.
*H01L 25/065* (2023.01)
*H01L 23/00* (2006.01)
*H01L 23/31* (2006.01)
*H01L 23/498* (2006.01)

(52) U.S. Cl.
CPC ...... *H01L 25/0657* (2013.01); *H01L 23/3128* (2013.01); *H01L 23/49816* (2013.01); *H01L 23/49822* (2013.01); *H01L 24/32* (2013.01); *H01L 24/29* (2013.01); *H01L 2224/29099* (2013.01); *H01L 2224/32145* (2013.01); *H01L 2224/32225* (2013.01); *H01L 2225/06506* (2013.01); *H01L 2225/0651* (2013.01); *H01L 2225/06562* (2013.01)

(58) Field of Classification Search
CPC .......................... H01L 23/3128; H01L 24/29
See application file for complete search history.

(56) References Cited

U.S. PATENT DOCUMENTS

| | | | |
|---|---|---|---|
| 5,647,123 A | 7/1997 | Greenwood et al. | |
| 6,015,652 A | 1/2000 | Ahlquist et al. | |
| 7,179,683 B2 | 2/2007 | Low et al. | |
| 7,485,494 B2 | 2/2009 | Kang et al. | |
| 7,754,581 B2 | 7/2010 | Ikeda et al. | |
| 10,497,675 B2 | 12/2019 | Kwak et al. | |
| 2013/0002665 A1 | 1/2013 | Shestak et al. | |
| 2021/0257336 A1* | 8/2021 | Maeda | H01L 21/6836 |

FOREIGN PATENT DOCUMENTS

| | | | | |
|---|---|---|---|---|
| JP | 2020096153 A | * | 6/2020 | ............. H01L 21/78 |
| KR | 10-737610 | | 7/2007 | |

* cited by examiner

*Primary Examiner* — Samuel A Gebremariam
(74) *Attorney, Agent, or Firm* — MORGAN, LEWIS & BOCKIUS LLP

(57) ABSTRACT

A semiconductor package including: a package substrate; a spacer chip attached on a surface of the package substrate, the spacer chip having a groove pattern in a surface of the spacer chip; at least one semiconductor chip mounted on the package substrate, the at least one semiconductor chip being attached on the surface of the spacer chip via an adhesive film; and a sealing member on the surface of the package substrate, the sealing member covering the spacer chip and the at least one semiconductor chip.

16 Claims, 16 Drawing Sheets

SEMICONDUCTOR PACKAGE AND A METHOD OF MANUFACTURING THE SEMICONDUCTOR PACKAGE

CROSS-REFERENCE TO RELATED APPLICATION

This application claims priority under 35 U.S.C. § 119 to Korean Patent Application No. 10-2021-0136254, filed on Oct. 14, 2021 in the Korean Intellectual Property Office (KIPO), the disclosure of which is incorporated by reference herein in its entirety.

1. TECHNICAL FIELD

The present disclosure relates to a semiconductor package and a method of manufacturing the semiconductor package. More particularly, the present disclosure relates to a semiconductor package including different semiconductor chips stacked on a package substrate and a method of manufacturing the same.

2. DESCRIPTION OF THE RELATED ART

In a multi-chip package (MCP), multiple dies and/or packaged devices are incorporated into a single package. In the MCP, a spacer chip may be used to support at least a portion of a semiconductor chip stacked thereon. The semiconductor chip may be attached to the spacer chip with an adhesive film such as a die attach film (DAF) in a die attach process. However, a portion of the DAF may flow away from the interface between the semiconductor chip and the spacer chip when the semiconductor chip is pressed on the spacer chip, thereby reducing product reliability and process productivity.

SUMMARY

Example embodiments of the present disclosure provide a mounting substrate for a semiconductor package having structural stability and improved electrical properties.

Example embodiments of the present disclosure provide a semiconductor package with a high reliability substrate.

Example embodiments of the present disclosure provide a method of manufacturing the semiconductor package.

According to example embodiments of the present disclosure, there is provided a semiconductor package including: a package substrate; a spacer chip attached on a surface of the package substrate, the spacer chip having a groove pattern in a surface of the spacer chip; at least one semiconductor chip mounted on the package substrate, the at least one semiconductor chip being attached on the surface of the spacer chip via an adhesive film; and a sealing member on the surface of the package substrate, the sealing member covering the spacer chip and the at least one semiconductor chip.

According to example embodiments of the present disclosure, there is provided a semiconductor package including: a package substrate having an upper surface and a lower surface opposite to each other, the package substrate having a plurality of substrate pads in the upper surface; a first spacer chip arranged on the upper surface of the package substrate, the first spacer chip having a groove pattern in an upper surface of the first spacer chip; at least one first semiconductor chip attached on the upper surface of the first spacer chip via an adhesive film; first conductive connection members electrically connecting chip pads of the first semiconductor chip and the substrate pads; and a sealing member on the upper surface of the package substrate, the sealing member covering the first spacer chip and the first semiconductor chip, wherein a portion of the adhesive film is disposed in the groove pattern of the first spacer chip.

According to example embodiments of the present disclosure, there is provided a semiconductor package including: a package substrate; a first semiconductor chip attached on a surface of the package substrate and electrically connected to the package substrate by first conductive connection members; a first spacer chip arranged on the surface of the package substrate and spaced apart from the first semiconductor chip; a second spacer chip arranged on the first semiconductor chip and the first spacer chip, the second spacer chip having a groove pattern in an upper surface of the second spacer chip; a second semiconductor chip attached on the upper surface of the second spacer chip via an adhesive film, the second semiconductor chip being electrically connected to the package substrate by second conductive connection members; and a sealing member on the surface of the package substrate, the sealing member covering the first semiconductor chip, the first spacer chip, the second spacer chip and the second semiconductor chip, wherein a portion of the adhesive film is disposed in the groove pattern of the second spacer chip.

According to example embodiments of the present disclosure, a semiconductor package may include a support structure and at least one semiconductor chip mounted on the support structure. The support structure may include a spacer chip having a groove pattern formed in an upper surface of the spacer chip. The semiconductor chip may be attached on the upper surface of the spacer chip using a die attach film (DAF) by a die attach process. A portion of the DAF may be filled into the groove pattern formed in the upper surface of the spacer chip.

Accordingly, in the die attach process, the portion of the DAF having fluidity may be prevented from flowing out of the spacer chip to the outside. Thus, it is possible to prevent voids from occurring in the bonding surface with the spacer chip, to thereby improve productivity and product reliability in the die attach process.

BRIEF DESCRIPTION OF THE DRAWINGS

Example embodiments of the present disclosure will be more clearly understood from the following detailed description taken in conjunction with the accompanying drawings.

FIG. 1 is a cross-sectional view illustrating a semiconductor package in accordance with example embodiments of the present disclosure.

FIG. 2 is a plan view illustrating the semiconductor package in FIG. 1.

FIG. 3 is an enlarged cross-sectional view illustrating a portion 'A' in FIG. 1.

FIG. 4 is a plan view illustrating a support structure in FIG. 3. FIG. 3 is a cross-sectional view taken along the line B-B' in FIG. 4.

FIG. 5 is a cross-sectional view illustrating a groove pattern of a support structure in accordance with example embodiments of the present disclosure.

FIG. 6 is a cross-sectional view illustrating a groove pattern of a support structure in accordance with example embodiments of the present disclosure.

FIG. 7 is a cross-sectional view illustrating a groove pattern of a support structure in accordance with example embodiments of the present disclosure.

FIGS. 8, 9, 10, 11, 12, 13, 14, 15 and 16 are views illustrating a method of manufacturing a semiconductor package in accordance with example embodiments of the present disclosure.

FIG. 17 is a plan view illustrating a spacer chip of a support structure in accordance with example embodiments of the present disclosure.

FIG. 18 is a cross-sectional view illustrating a semiconductor package in accordance with example embodiments of the present disclosure.

FIG. 19 is a cross-sectional view illustrating a semiconductor package in accordance with example embodiments of the present disclosure.

FIG. 20 is a cross-sectional view illustrating a semiconductor package in accordance with example embodiments of the present disclosure.

DETAILED DESCRIPTION OF THE EMBODIMENTS

Hereinafter, example embodiments of the present disclosure will be explained in detail with reference to the accompanying drawings.

Figure 1:
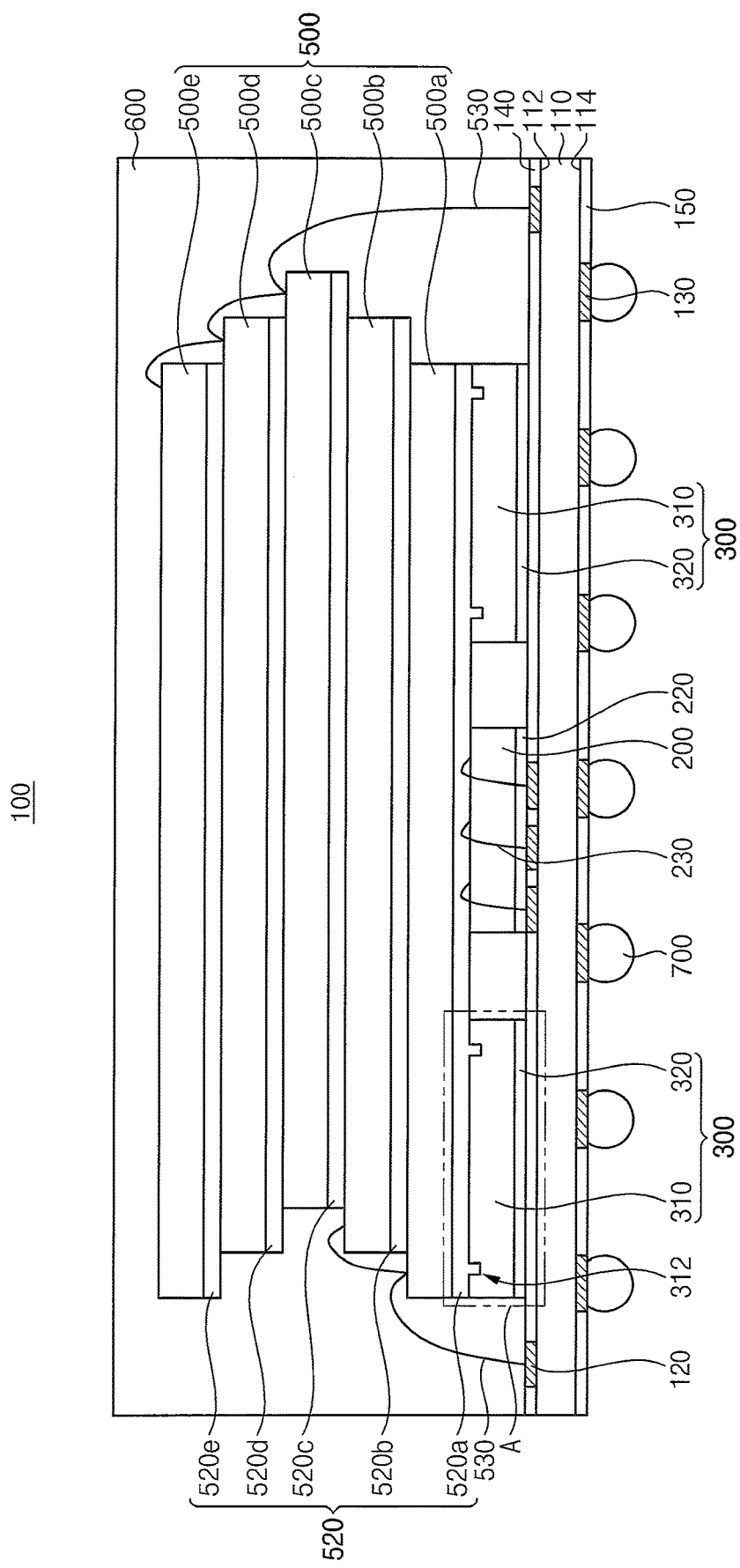
FIGS. 1 to 20 represent non-limiting, example embodiments of the present disclosure as described herein.
Figure 2:
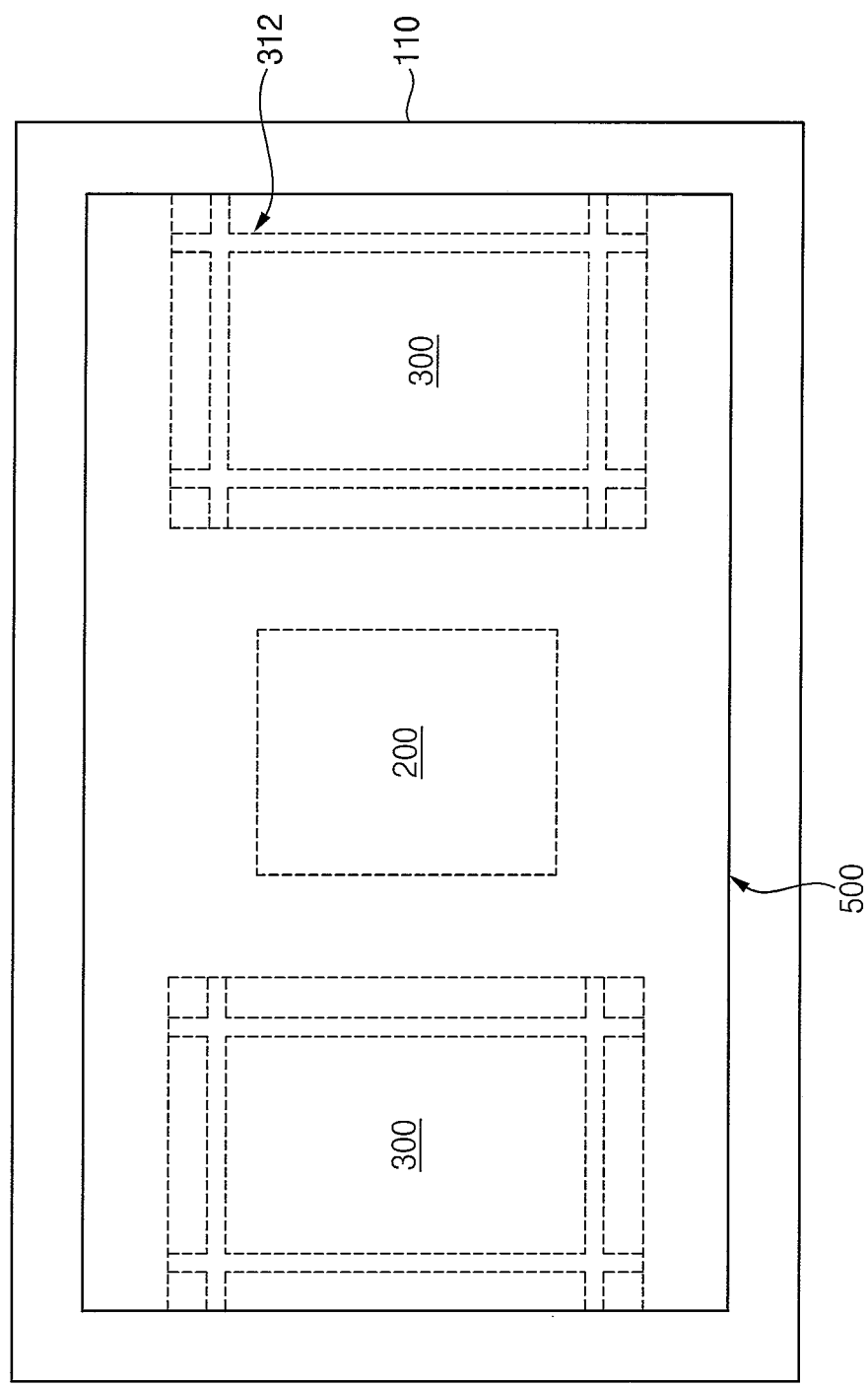
Figure 3:
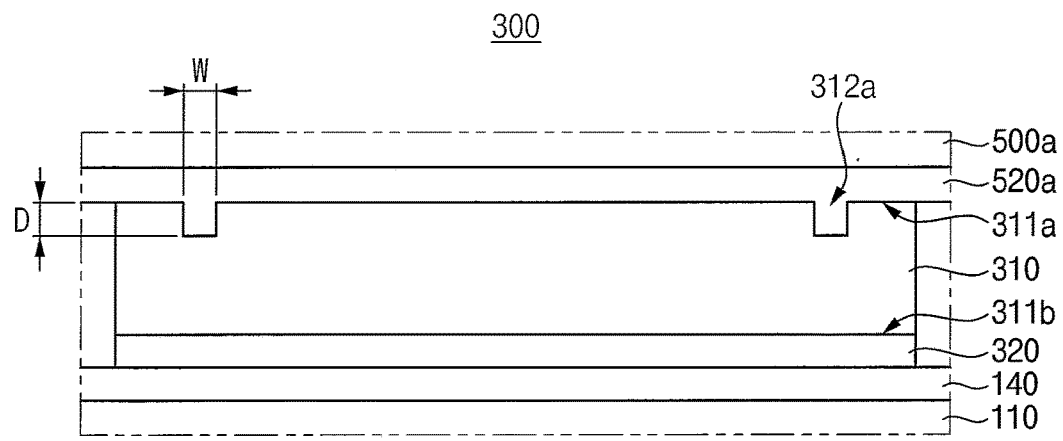
Figure 4:
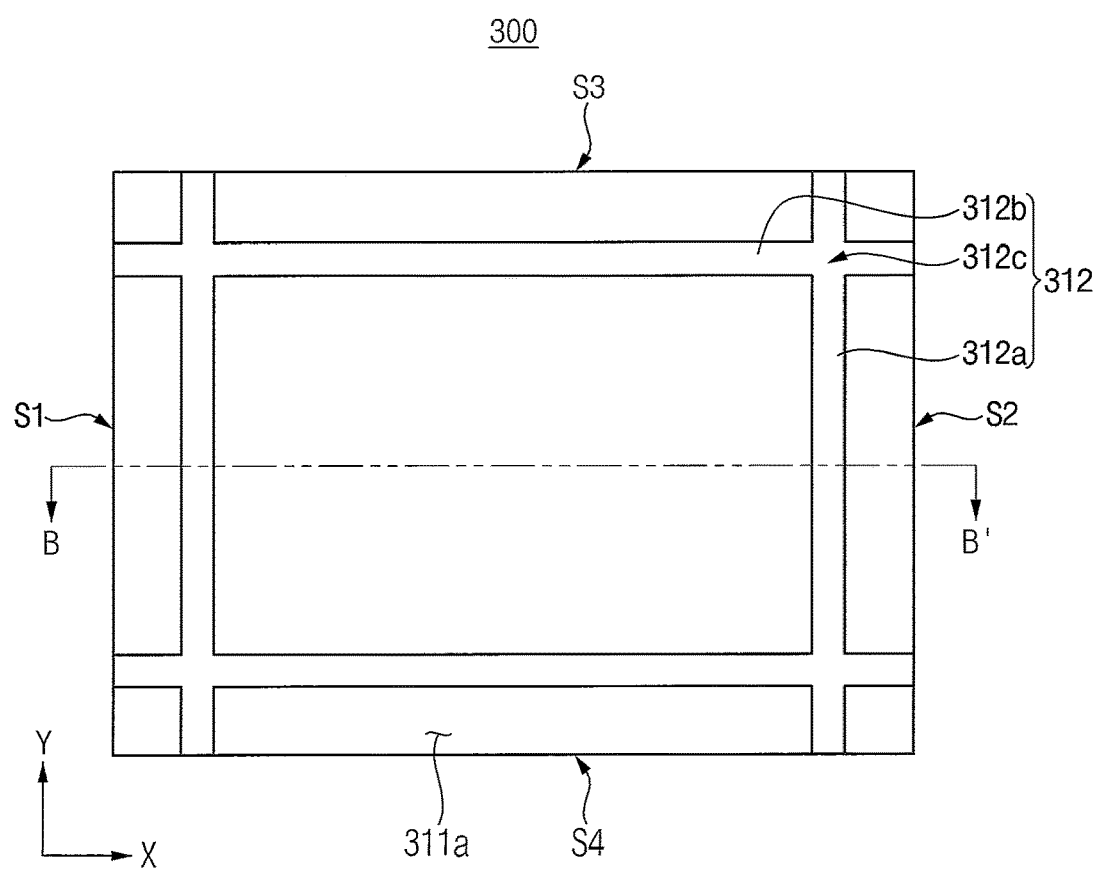

FIG. 1 is a cross-sectional view illustrating a semiconductor package in accordance with example embodiments of the present disclosure. FIG. 2 is a plan view illustrating the semiconductor package in FIG. 1. FIG. 3 is an enlarged cross-sectional view illustrating a portion 'A' in FIG. 1. FIG. 4 is a plan view illustrating a support structure in FIG. 3. FIG. 3 is a cross-sectional view taken along the line B-B' in FIG. 4.

Referring to FIGS. 1 to 4, a semiconductor package 100 may include a package substrate 110, at least one first semiconductor chip 200, at least one support structure 300, at least one second semiconductor chip 500 and a sealing member 600. Additionally, the semiconductor package 100 may further include conductive connection members 230 and 530 electrically connecting the first semiconductor chip 200 and the second semiconductor chip 500 to the package substrate 110. Further, the semiconductor package 100 may further include external connection members 700.

In example embodiments of the present disclosure, the package substrate 110 may be a multilayer circuit board having an upper surface 112 and a lower surface 114 facing each other. For example, the package substrate 110 may be a printed circuit board (PCB), a flexible substrate, a tape substrate, etc. The printed circuit board may be a multilayer circuit board having vias and various circuits therein.

Substrate pads 120 may be disposed in the upper surface 112 of the package substrate 110. The substrate pads 120 may be connected to a plurality of wirings respectively. The wirings may extend in the upper surface 112 or the inside of the package substrate 110. For example, at least a portion of the wiring may be configured to use at least one of the substrate pads 120 as a landing pad.

Although some substrate pads 120 are illustrated in FIG. 1, the number and locations of the substrate pads 120 are merely examples, and thus, they are not be limited thereto. It will be appreciated that the wirings as well as the substrate pads 120 may not be illustrated in the later figures and explanations concerning these elements will be omitted for the sake of simplicity.

A first insulating layer 140 may be provided on the upper surface 112 of the package substrate 110 to cover the wirings and expose at least portions of the substrate pads 120. The first insulating layer 140 may cover the entire upper surface 112 of the package substrate 110 except for the substrate pad 120. For example, the first insulating layer 140 may include a solder resist.

In example embodiments of the present disclosure, the first semiconductor chip 200 may be mounted on the package substrate 110. The first semiconductor chip 200 may be attached on the upper surface 112 of the package substrate 110 using an adhesive film 220. The first semiconductor chip 200 may include an integrated circuit. For example, the adhesive film may include a film such as a die attach film (DAF). The first semiconductor chip 200 may be a logic chip including a logic circuit. The logic chip may be a controller that controls memory chips.

The first semiconductor chip 200 may have chip pads provided in an upper surface, in other words, an active surface thereof. The chip pads may include an input/output terminal functioning as a power pin, an input/output terminal functioning as a ground pin, or an input/output terminal functioning as a data pin.

The first semiconductor chip 200 may be electrically connected to the package substrate 110 by first conductive connecting members 230. In particular, the first conductive connection member 230 may electrically connect the chip pad of the first semiconductor chip 200 to the substrate pad 120 of the package substrate 110. For example, the first conductive connection member 230 may include a bonding wire. Accordingly, the first semiconductor chip 200 may be stacked on the package substrate 110 by the adhesive film 220 and may be electrically connected to the package substrate 110 through the plurality of first conductive connection members 230.

Alternatively, the first conductive connection member 230 may include a solder bump, a through electrode, a solder ball, a conductive paste, etc. For example, the first semiconductor chip 200 may be mounted on the package substrate 110 by a flip chip bonding method. In this case, the first semiconductor chip 200 may be mounted on the package substrate 110 such that the active surface on which the chip pads are formed faces the package substrate 110. The chip pads of the first semiconductor chip 200 may be electrically connected to the substrate pads 120 of the package substrate 110 by conductive bumps, for example, solder bumps. Additionally, a plurality of the first semiconductor chips 200 may be sequentially stacked on the package substrate 110.

In example embodiments of the present disclosure, the support structure 300 may be arranged on the package substrate 110 to be spaced apart from the first semiconductor chip 200. The support structure 300 may be attached on the upper surface 112 of the package substrate 110 using an adhesive film 320. The support structure 300 may be arranged between the package substrate 110 and other electronic components to support other electronic components.

In particular, the support structure 300 may include a spacer chip 310 and the adhesive film 320 attached to a lower surface 311b of the spacer chip 310. For example, the adhesive film 320 may include a die attach film (DAF). The spacer chip 310 may be attached on the upper surface 112 of the package substrate 110 using the adhesive film 320 by a die attach process. A height of the support structure 300 from the package substrate 110 may be substantially the same as a height of the first semiconductor chip 200. The spacer chip 310 may be a dummy chip that is not electrically connected to the package substrate 110.

As illustrated in FIG. 2, the package substrate 110 may have a rectangular shape. The first semiconductor chip 200 may be disposed in a central region of the package substrate 110, and two support structures 300 may be disposed in both sides of the first semiconductor chip 200 respectively. Although one first semiconductor chip 200 and two supporting structures 300 are illustrated, the present disclosure is not limited thereto. As will be described later, the second semiconductor chip 500 may be mounted on the package substrate 110 to be supported on the first semiconductor chip 200 and the two support structures 300.

As illustrated in FIGS. 3 and 4, the spacer chip 310 may have a groove pattern 312 provided in an upper surface 311a to have a predetermined depth D and a width W. The spacer chip 310 may have a first side surface S1 and a second side surface S2 extending in a direction parallel with a first direction (Y direction) perpendicular to the upper surface 311a and facing each other and a third side surfaces S3 and a fourth side surface S4 extending in a direction parallel with a second direction (X direction) perpendicular to the first direction and facing each other. The spacer chip 310 may have a rectangular shape when viewed in plan view.

The groove pattern 312 may include a first extension portion 312a extending in the first direction (Y direction) and a second extension portion 312b extending in the second direction (X direction). Additionally, the groove pattern 312 may further include an intersection portion 312c where the first extension portion 312a and the second extension portion 312b cross each other. The groove pattern 312 may extend along a peripheral region of the spacer chip 310.

The two first extension portions 312a may extend parallel with each other. One of the two first extension portions 312a may be arranged adjacent to the first side surface S1 of the spacer chip 310 and the other of the two first extension portions 312a may be arranged adjacent to the second side surface S2 of the spacer chip 310. The first extension portion 312a may extend from the third side surface S3 of the spacer chip 310 to the fourth side surface S4 of the spacer chip 310. Both end portions of the first extension portion 312a may be exposed through the third and fourth side surfaces S3 and S4, respectively.

The two second extension portions 312b may extend parallel with each other. One of the two second extension portions 312b may be arranged adjacent to the third side surface S3 of the spacer chip 310 and the other of the two second extension portions 312b may be arranged adjacent to the fourth side surface S4 of the spacer chip 310. The second extension portion 312b may extend from the first side surface S1 of the spacer chip 310 to the second side surface S2 of the spacer chip 310. Both end portions of the second extension portion 312b may be exposed through the first and second side surfaces S1 and S2, respectively.

The groove pattern 310 may have a U-shaped cross-sectional shape, but it may not be limited thereto, and may have various cross-sectional shapes depending on a shape of a blade for forming the groove pattern 310. For example, the groove pattern 310 may have a V-shaped cross-sectional shape.

In example embodiments of the present disclosure, a plurality of the second semiconductor chips 500 may be stacked on the first semiconductor chip 200 and the support structures 300. The second semiconductor chips 500a, 500b, 500c, 500d and 500e may be attached on the support structure 300 using adhesive films 520a, 520b, 520c, 520d and 520e. For example, the adhesive film of each of the adhesive films 520a, 520b, 520c, 520d and 520e may include a film such as DAF. A planar area of the second semiconductor chip 500 may be greater than a planar area of the first semiconductor chip 200 or the spacer chip 310. Accordingly, the second semiconductor chips 500a, 500b, 500c, 500d and 500e may be supported and mounted on the package substrate 110 by the support structure 300.

The second semiconductor chips 500a, 500b, 500c, 500d and 500e may include a memory chip including a memory circuit. For example, the second semiconductor chips 500 may include a nonvolatile memory device such as dynamic random access memory (DRAM) or NAND flash memory. It will be understood that the number, size, arrangement, etc. of the second semiconductor chips 500a, 500b, 500c, 500d and 500e are merely examples, and the present disclosure is not limited thereto.

The second semiconductor chips 500a, 500b, 500c, 500d and 500e (also referred to as dies) may be sequentially or offset aligned in a zigzag manner. For example, the second and third dies 500b and 500c may be stacked in a first cascade structure. The second and third dies 500b and 500c may be sequentially offset aligned in a first lateral direction (e.g., right direction) of the package substrate 110. The fourth and fifth dies 500d and 500e may be stacked in a second cascade structure. The fourth and fifth dies 500d and 500e may be sequentially offset aligned in a second lateral direction (e.g., left direction) of the package substrate 110. The first to fifth dies 500a, 500b, 500c, 500d and 500e may be attached on the first semiconductor chip 200 and the spacer chip 310 using the adhesive film 520 such as a DAF.

The lowermost second semiconductor chip 500a may be attached on the upper surface 311a of the spacer chip 310 by using the adhesive film 520a through a die attach process. The lowermost second semiconductor chip 500a may be attached onto the spacer chip 310 by a die attaching tool and heated to a high temperature by a heater block in a support system supporting the package substrate 110.

A portion of the DAF, which has fluidity due to the pressure and temperature, may fill the recess of the groove pattern 312 formed in the upper surface 311a of the spacer chip 310, and thus, the DAF portion may be prevented from flowing out of the spacer chip 310. Thus, it is possible to increase a bond force, which is a major process factor during the die attach process, and reduce the process time.

Further, the groove pattern 312 may increase surface roughness of the spacer chip 310 to thereby increase an adhesion force between the second semiconductor chip 500a disposed on the spacer chip 310.

In example embodiments of the present disclosure, the sealing member 600 may be formed on the package substrate 110 to protect the first semiconductor chip 200, the support structure 300 and the second semiconductor chips 500 from the outside. The sealing member 600 may include an epoxy mold compound (EMC).

External connection pads 130 for providing electrical signals may be provided in the lower surface 114 of the package substrate 110. The external connection pads 130 may be exposed by a second insulating layer 150. The second insulating layer 150 may include a silicon oxide layer, a silicon nitride layer, or a silicon oxynitride layer. The external connection member 700 may be disposed on the external connection pad 130 of the package substrate 110 for electrical connection with an external device. For example, the external connection member 700 may be a solder ball. The semiconductor package 100 may be mounted on a module substrate via the solder balls to constitute a memory module.

As mentioned above, the semiconductor package 100 may include the support structure 300 and a plurality of the second semiconductor chips 500 supported on the support structure 300. The support structure 300 may include the spacer chip 310 having the groove pattern 312 formed in the upper surface 311a of the spacer chip 310 and the adhesive film 320 attached to the lower surface 312a of the spacer chip 310. The lowermost second semiconductor chip 500a may be attached on the upper surface 311a of the spacer chip 310 using a DAF by a die attach process. The portion of the DAF may be filled into the groove pattern 312 formed in the upper surface 311a of the spacer chip 310.

Accordingly, in the die attach process, the portion of the DAF having fluidity may be prevented from flowing out of the spacer chip 310 to the outside. For example, the portion of the DAF may remain in the groove pattern 312. Thus, it is possible to prevent voids from occurring in the bonding surface with the spacer chip 310, to thereby improve productivity and product reliability in the die attach process.

Figure 5:
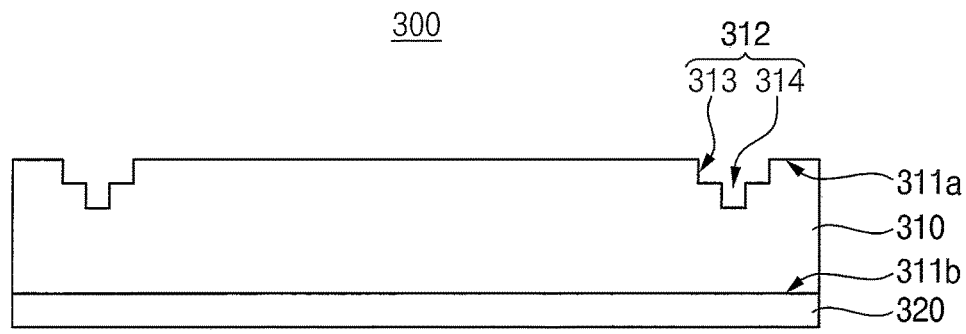

FIG. 5 is a cross-sectional view illustrating a groove pattern of a support structure in accordance with example embodiments of the present disclosure.

Referring to FIG. 5, a groove pattern 312 of a support structure 300 may include a plurality of extension portions, and each of the extension portions may have first and second recesses 313 and 314 in communication with each other. As will be described later, the first and second recesses 313 and 314 may be formed by a step cutting method using two blades.

The first recess 313 may have a first depth from an upper surface 311a of a spacer chip 310, and the second recess 314 may have a second depth from a bottom surface of the first recess 313. The second depth of the second recess 314 may be greater than the first depth of the first recess 313. The first recess 313 may have a first width, and the second recess 314 may have a second width less than the first width. Each of the first and second recesses 313 and 314 may have a U-shaped cross-sectional shape.

Figure 6:
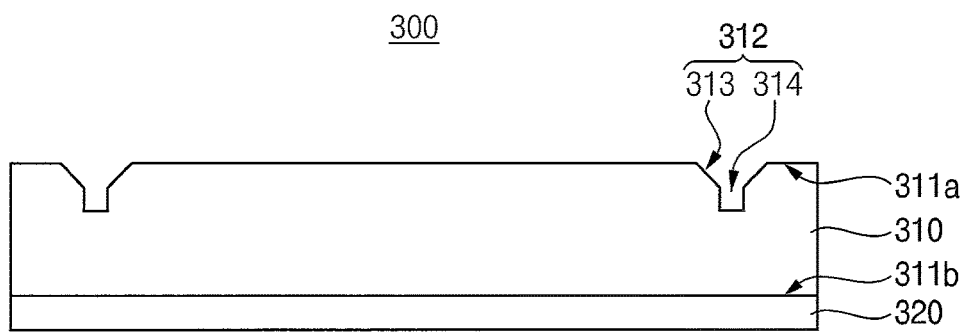

FIG. 6 is a cross-sectional view illustrating a groove pattern of a support structure in accordance with example embodiments of the present disclosure.

Referring to FIG. 6, a groove pattern 312 of a support structure 300 may include a plurality of extension portions, and each of the extension portions may have first and second recesses 313 and 314 in communication with each other.

The first recess 313 may have a first depth from an upper surface 311a of a spacer chip 310, and the second recess 314 may have a second depth from a bottom surface of the first recess 313. The first recess 313 may have a first width, and the second recess 314 may have a second width less than the first width. The first recess 313 may have a V-shaped cross-sectional shape, and the second recess 314 may have a U-shaped cross-sectional shape. In other words, the first recess 313 may have slanted sidewalls.

Figure 7:
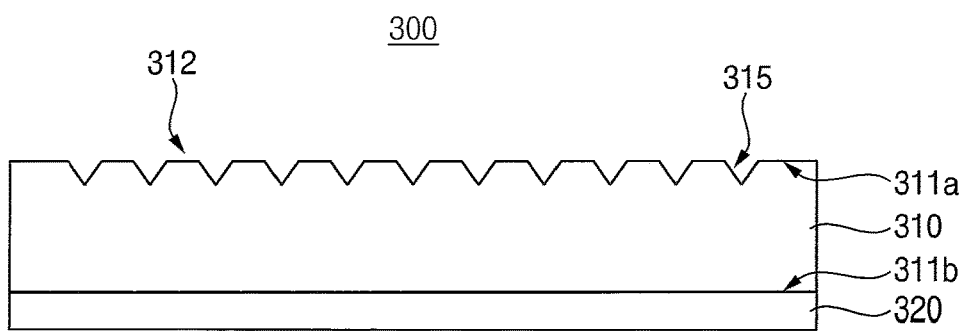

FIG. 7 is a cross-sectional view illustrating a groove pattern of a support structure in accordance with example embodiments of the present disclosure.

Referring to FIG. 7, a groove pattern 312 of a support structure 300 may include a plurality of recesses 315 formed in an upper surface 311a to be spaced apart from each other. The recesses 315 may extend in at least one direction. The recesses 315 may be formed to have a relatively small depth by a blade or a surface treatment process (e.g., a finishing method). For example, the recess 315 may have a depth of about 20 μm to about 50 μm.

Accordingly, the upper surface 311 of a spacer chip 310 may have a predetermined roughness due to the recesses 315, thereby increasing an adhesion force with a semiconductor chip disposed on the spacer chip 310. In this case, the surface roughness of the spacer chip 310 may be expressed as an average roughness Ra of the upper surface 311 in which the recesses 315 are formed.

Hereinafter, a method of manufacturing the semiconductor package in FIG. 1 will be explained.

Figure 8:
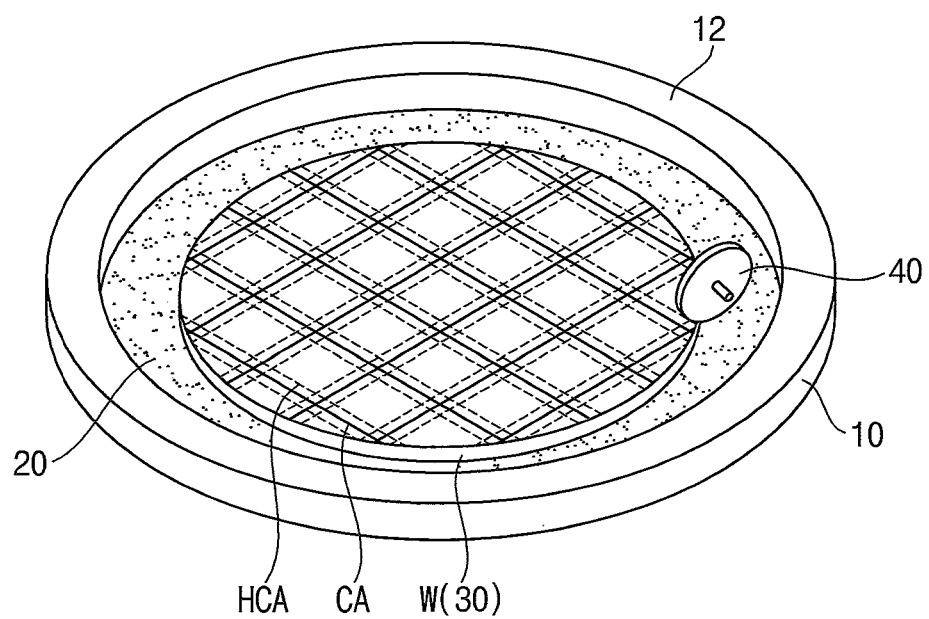
Figure 9:
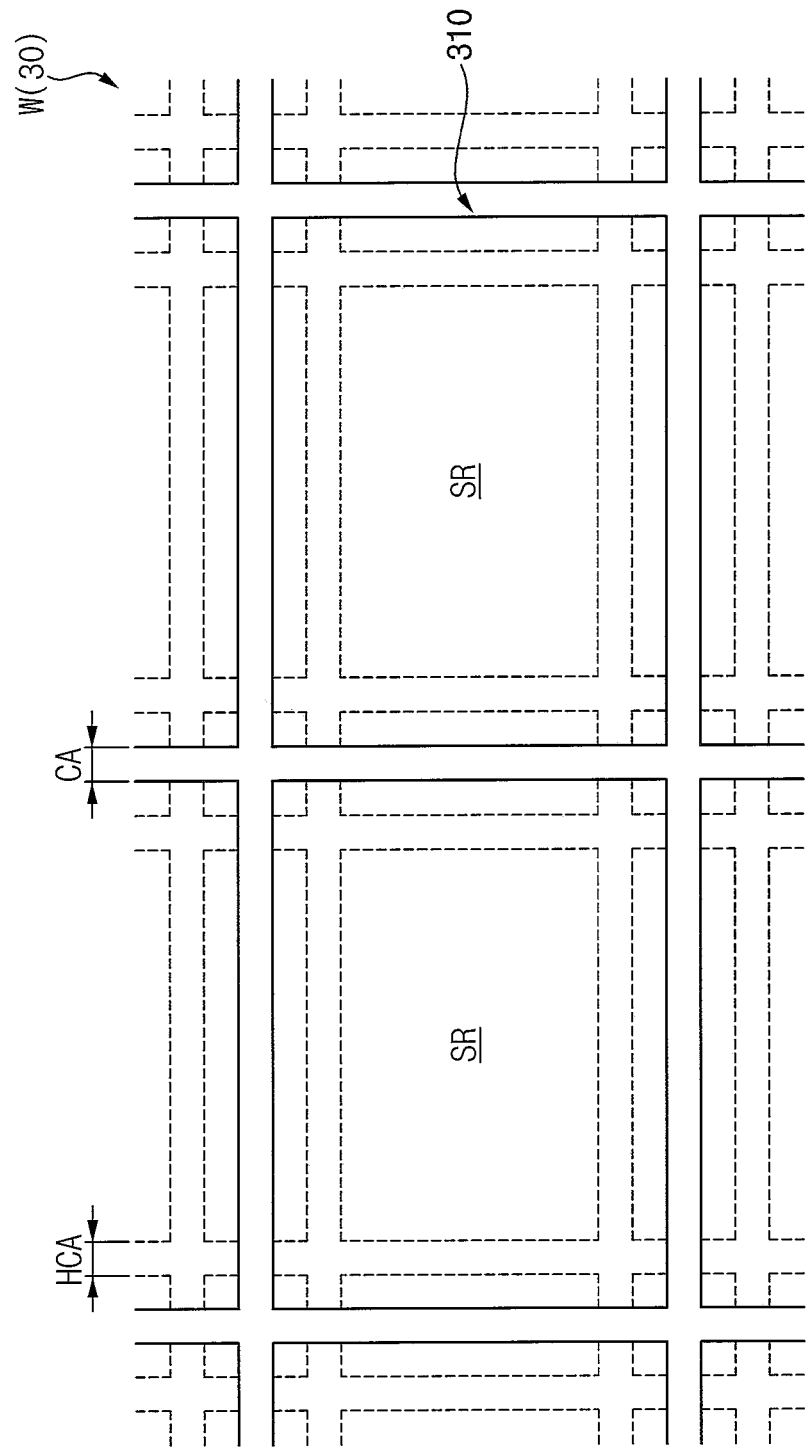
Figure 10:
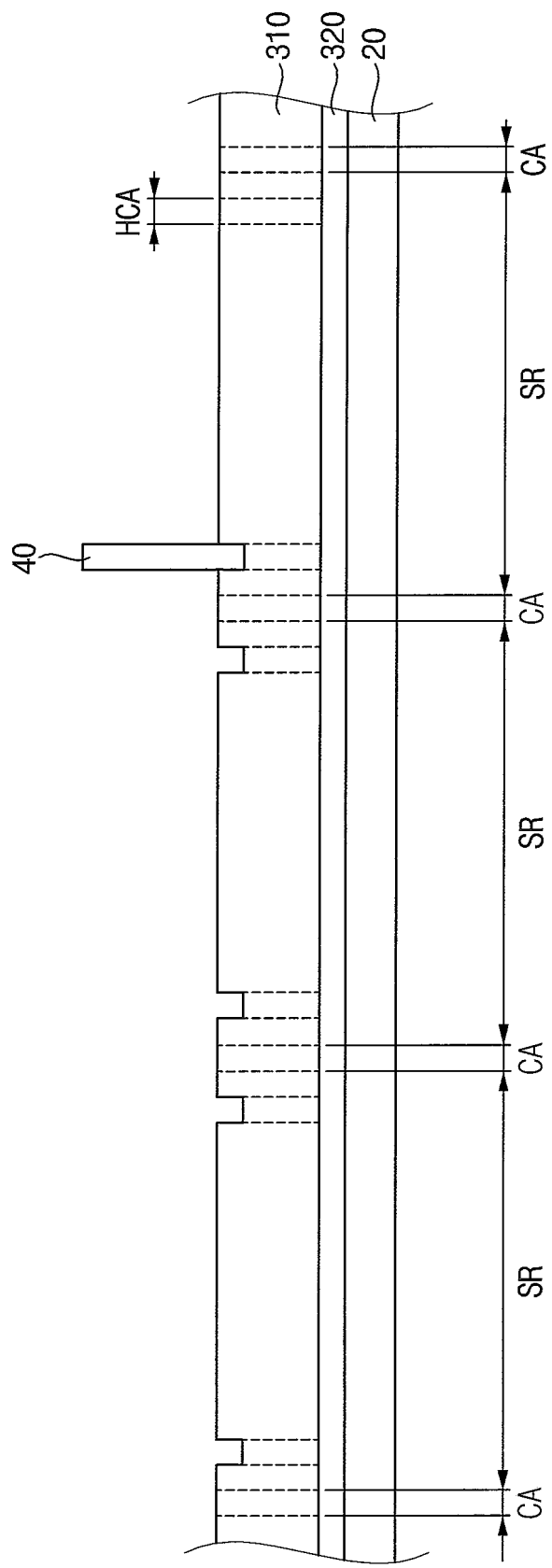
Figure 11:
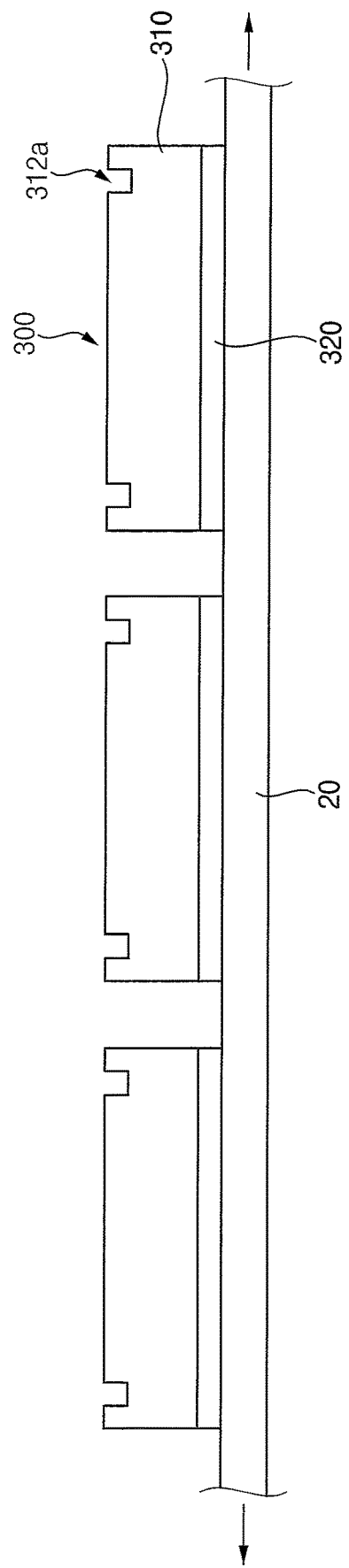
Figure 12:
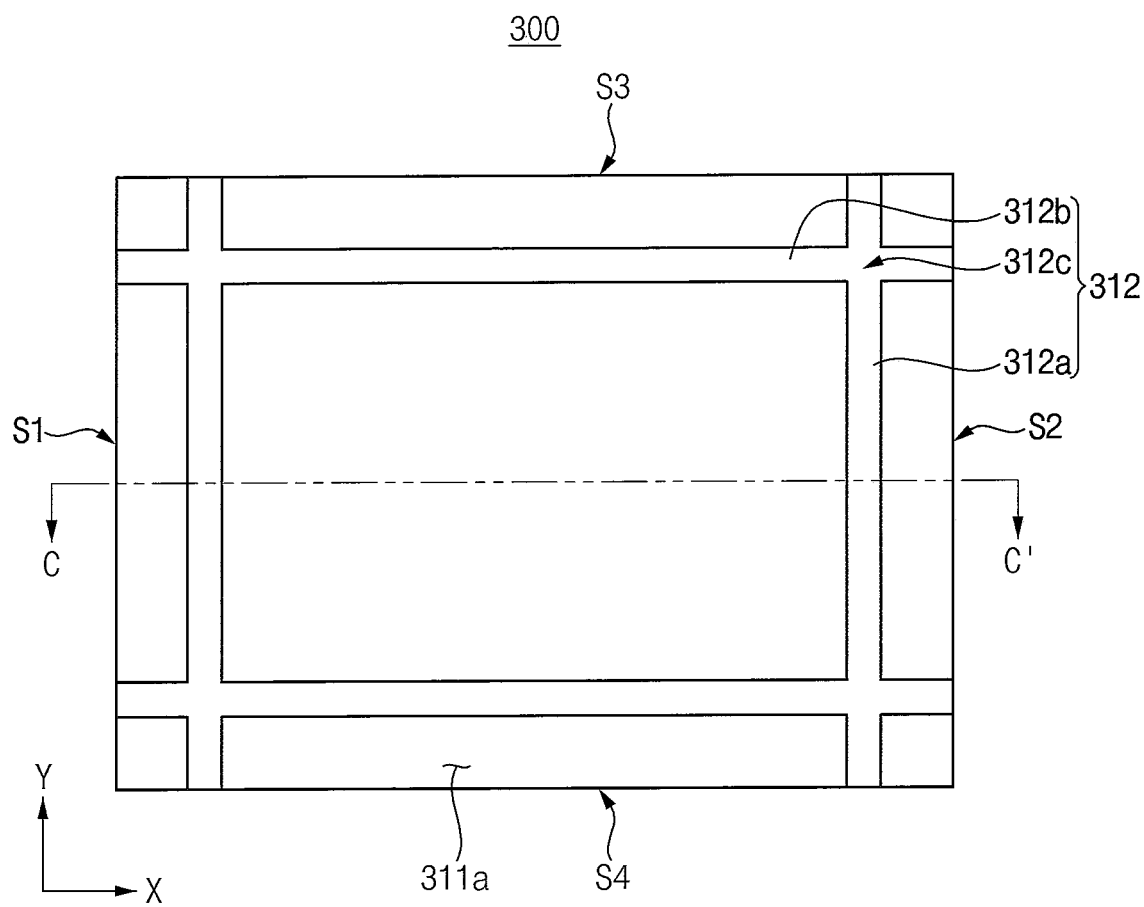
Figure 13:
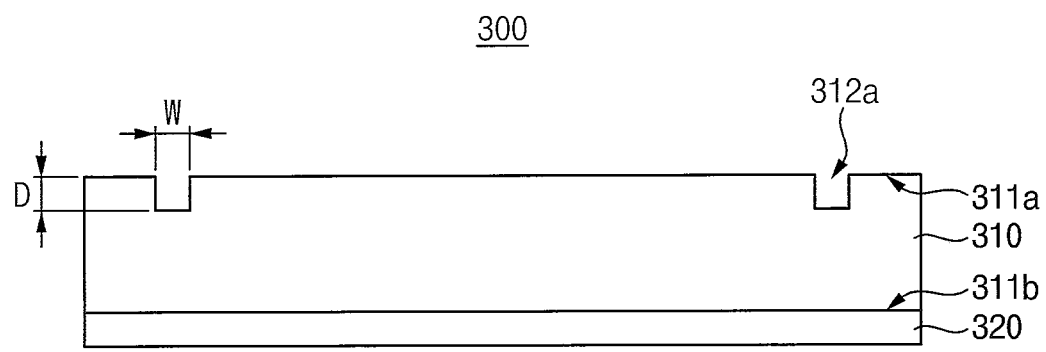

FIGS. 8 to 16 are views illustrating a method of manufacturing a semiconductor package in accordance with example embodiments of the present disclosure. FIG. 8 is a perspective view illustrating a wafer adhered on an adhesive tape sheet. FIG. 9 is a plan view illustrating a portion of the wafer in FIG. 8. FIG. 10 is a cross-sectional view illustrating a groove pattern formed by a blade sawing process. FIG. 11 is a cross-sectional view illustrating a spacer chip cut by a blade sawing process. FIG. 12 is a plan view illustrating a support structure in FIG. 11. FIG. 13 is a cross-sectional view taken along the line C-C' in FIG. 12.

Referring to FIGS. 8 to 13, a wafer W may be cut by a sawing process to provide an individualized support structure 300.

As illustrated in FIGS. 8 and 9, a backside of the silicon wafer W may be partially removed by a polishing process such that the wafer W has a desired thickness, and then, the silicon wafer W may be mounted on an adhesive tape sheet 20 (e.g., Wafer Mounting).

In particular, the wafer W may include a spacer chip region SR and a cutting region CA defining the spacer chip region SR. The spacer chip region SR may include a groove pattern region HCA. For example, the wafer W may include may include silicon, germanium, silicon-germanium, or III-V compounds, e.g., GaP, GaAs, GaSb, etc. The wafer W may be grinded to have a thickness of, for example, about 50 μm to about 800 μm.

After the adhesive tape sheet 20 is attached on a ring frame 10, the wafer W may be attached on the adhesive tape sheet 20. For example, the ring frame 10 may have an annular shape. The ring frame 10 may have a top surface 12 and a bottom surface and opposite to each other. The adhesive tape sheet 20 may be a dicing adhesive tape having a circular shape. The adhesive tape sheet 20 may have a tacky surface and a non-tacky surface opposite to each other. A peripheral portion of the tacky surface of the adhesive tape sheet 20 may be attached to the bottom surface of the ring frame 10. The ring frame 10 may be a carrier frame configured to hold the adhesive tape sheet 20 and support the wafer W while following substrate processing processes are performed.

Then, the silicon wafer W may be cut by a sawing process using a blade 40 to form individual spacer chips 310.

First, as illustrated in FIG. 10, an upper surface of the groove pattern area HCA may be partially removed using the blade 40 to form a groove pattern 312 in the upper surface 311a of the spacer chip 310. Then, the cutting region CA may be removed using the blade 40 to form the individual spacer chips 310. Then, as illustrated in FIG. 11, the adhesive tape sheet 20 may be radially expanded by a tape expanding device such that the divided spacer chips 310 on the adhesive tape sheet 20 are radially spaced apart from each other.

For example, the groove pattern 312 may be formed using one blade. Alternatively, the groove pattern 312 may be formed by performing a step cutting process in which the upper portion of the one groove pattern area HCA is cut several times using two blades. By the step cutting process, the groove pattern 312 may be formed to have a first recess having a first depth from the upper surface 311a of the spacer chip 310 and a second recess having a second depth from the first recess. Sidewalls of the first and second recesses may extend in a thickness direction or a direction inclined with respect to the thickness direction. For example, the first and second recesses may have a U-shaped cross-sectional structure or a V-shaped cross-sectional structure.

Additionally, the groove pattern 312 may include a plurality of recesses that is formed in the upper surface 311a of the spacer chip 310 to be spaced apart from each other such that the upper surface 311a of the spacer chip 310 has a predetermined roughness. The recesses may be formed by the blade 40 to have a relatively small depth from the upper surface 311a.

As illustrated in FIG. 12, the spacer chip 310 may have a first side surface S1 and a second side surface S2 extending in a direction parallel with a first direction (Y direction) perpendicular to the upper surface 311a of the spacer chip 310 and facing each other and a third side surface S3 and a fourth side surface S4 extending in a direction parallel with a second direction (X direction) perpendicular to the first direction and facing each other. The spacer chip 310 may have a rectangular shape when viewed in plan view.

The groove pattern 312 may be formed in the upper surface 311a of the spacer chip 310. The groove pattern 312 may include a first extension portion 312a extending in the first direction (Y direction) and a second extension portion 312b extending in the second direction (X direction). Additionally, the groove pattern 312 may further include an intersection portion 312c where the first extension portion 312a and the second extension portion 312b cross each other. The groove pattern 312 may be formed to extend along a peripheral region of the spacer chip 310.

The two first extension portions 312a may extend parallel with each other. One of the two first extension portions 312a may be arranged adjacent to the first side surface S1 of the spacer chip 310 and the other of the two first extension portions 312a may be arranged adjacent to the second side surface S2 of the spacer chip 310. The first extension portion 312a may extend from the third side surface S3 of the spacer chip 310 to the fourth side surface S4 of the spacer chip 310. Both end portions of the first extension portion 312a may be exposed through the third and fourth side surfaces S3 and S4, respectively.

The two second extension portions 312b may extend parallel with each other. One of the two second extension portions 312b may be arranged adjacent to the third side surface S3 of the spacer chip 310 and the other of the two second extension portions 312b may be arranged adjacent to the fourth side surface S4 of the spacer chip 310. The second extension portion 312b may extend from the first side surface S1 of the spacer chip 310 to the second side surface S2 of the spacer chip 310. Both end portions of the second extension portion 312b may be exposed through the first and second side surfaces S1 and S2, respectively.

As illustrated in FIG. 13, the support structure 300 may include the spacer chip 310 as a dummy chip cut from the wafer W and an adhesive film 320 attached to the lower surface 311b of the spacer chip 310. For example, the adhesive film 320 may be a film such as a DAF. The support structure 300 to be described later may be a support spacer used to stack semiconductor chips having different sizes.

For example, the depth D of the groove pattern 312 may be within a range of 30% to 70% of a thickness of the spacer chip 310. A width W of the groove pattern 312 may be substantially the same as a width of the portion sawed by the blade 40.

Figure 14:
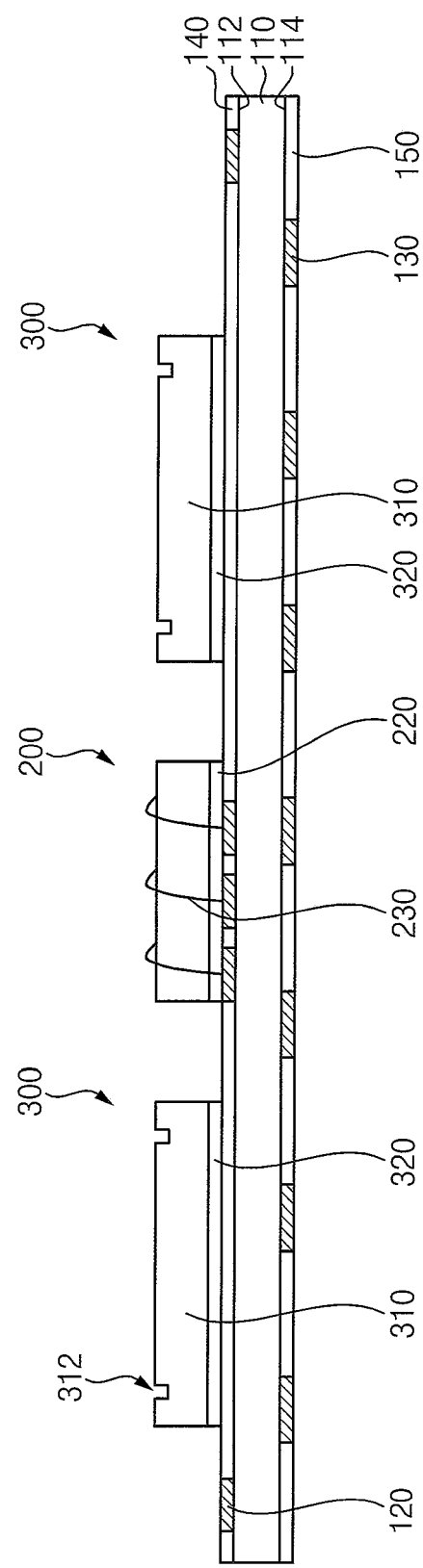

Referring to FIG. 14, a first semiconductor chip 200 and at least one support structure 300 may be stacked on a package substrate 110.

In example embodiments of the present disclosure, the package substrate 110 may be a substrate having an upper surface 112 and a lower surface 114 facing each other. For example, the package substrate 110 may be a printed circuit board (PCB). The printed circuit board may be a multilayer circuit board having vias and various circuits therein.

The first semiconductor chip 200 may be attached on an upper surface 112 of the package substrate 110 using an adhesive film 220. The first semiconductor chip 110 may be attached on the upper surface 112 of the package substrate 110 using the adhesive film 220 by a die attach process. The first semiconductor chip 200 may be a logic chip including a logic circuit. The logic chip may be a controller that controls memory chips.

Then, a wire bonding process may be performed to connect chip pads of the first semiconductor chip 200 to substrate pads 120 on the upper surface 112 of the package substrate 110. The chip pads of the first semiconductor chip 200 may be connected to the substrate pads 120 by first conductive connecting members 230. The first conductive connecting members 230 may include bonding wires.

In example embodiments of the present disclosure, the spacer chip 310 may be attached on the upper surface 112 of the package substrate 110 to be spaced apart from the first semiconductor chip 200 using an adhesive film 320. The two spacer chips 310 may be disposed in both sides of the first semiconductor chip 200. The spacer chip 310 may be attached on the upper surface 112 of the package substrate 110 using the adhesive film 320 by a die attach process.

Figure 15:
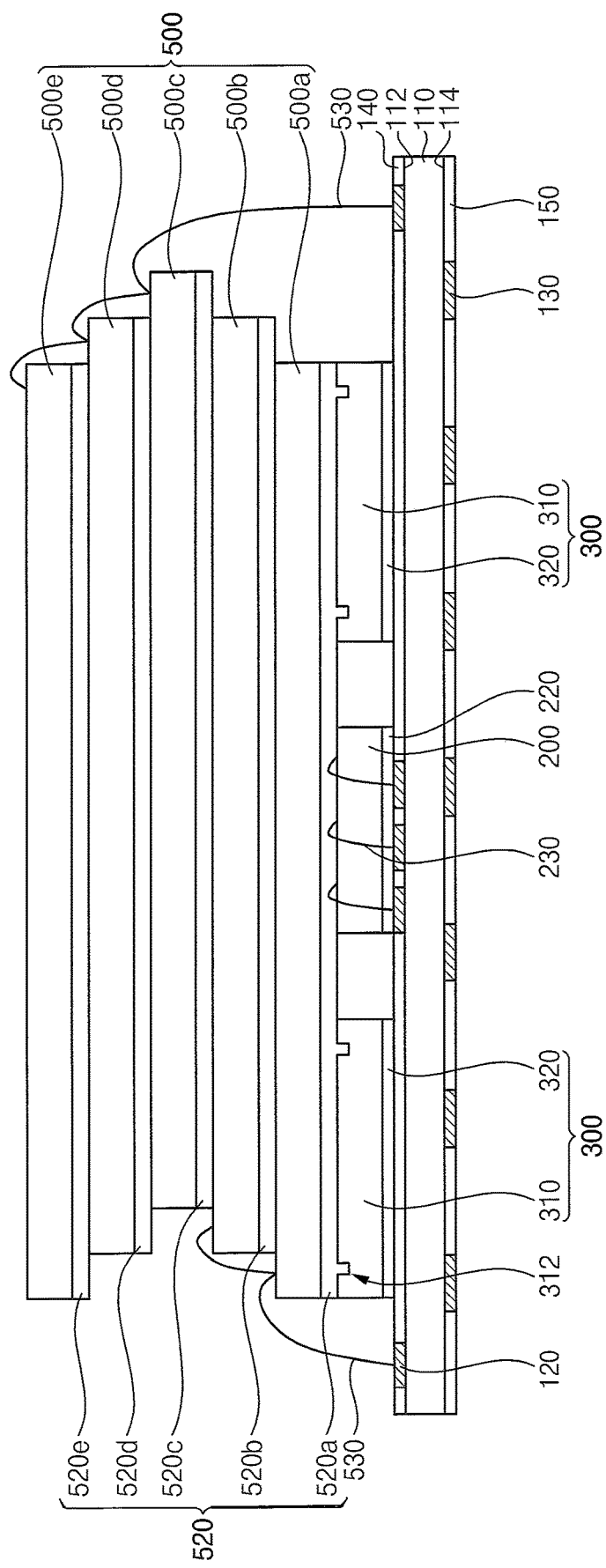

Referring to FIG. 15, a plurality of second semiconductor chips 500 may be stacked on the first semiconductor chip 200 and the support structures 300.

The second semiconductor chips 500a, 500b, 500c, 500d and 500e may be attached on the support structures 300 using adhesive films 520a, 520b, 520c, 520d and 520e. A planar area of the second semiconductor chip 500 may be larger than a planar area of the first semiconductor chip 200 or the spacer chip 310. Accordingly, the second semiconductor chips 500a, 500b, 500c, 500d and 500e may be supported and mounted on the package substrate 110 by the support structure 300.

The second semiconductor chips 500a, 500b, 500c, 500d and 500e may be sequentially or offset aligned in a zigzag manner. For example, the second and third dies 500b and 500c may be stacked in a first cascade structure. The second and third dies 500b and 500c may be sequentially offset aligned in a first lateral direction (e.g., right direction) of the package substrate 110. The fourth and fifth dies 500d and 500e may be stacked in a second cascade structure. The fourth and fifth dies 500d and 500e may be sequentially offset aligned in a second lateral direction (e.g., left direction) of the package substrate 110. The first to fifth dies 500a, 500b, 500c, 500d and 500e may be attached on the first semiconductor chip 200 and the spacer chip 310 using the adhesive film 520 such as a DAF.

The first die 510a may be attached on the upper surface 311a of the spacer chip 310 by using the adhesive film 520a by a die attach process. The first die 510a may be attached onto the spacer chip 310 by a die attaching tool and heated to a high temperature by a heater block in a support system supporting the package substrate 110.

A portion of the DAF, which has fluidity due to the pressure and temperature, may fill the inside of the groove pattern 312 formed in the upper surface 311a of the spacer chip 310, and thus, the DAF portion may be prevented from flowing out of the spacer chip 310. In other words, the DAF may remain in the groove pattern 312. Thus, it is possible to increase a bond force, which is a major process factor during the die attach process, and reduce the process time.

Further, the groove pattern 312 may increase the surface roughness of the spacer chip 310 to thereby increase an adhesion force between the first die 510a and the spacer chip 310.

Then, a wire bonding process may be performed to connect chip pads of the second semiconductor chips 500a, 500b, 500c, 500d and 500e to the substrate pads 120 in the upper surface 112 of the package substrate 110. The chip pads of the second semiconductor chips 500a, 500b, 500c, 500d and 500e may be connected to the substrate pads 120 by second conductive connecting members 530, in other words, bonding wires.

Figure 16:
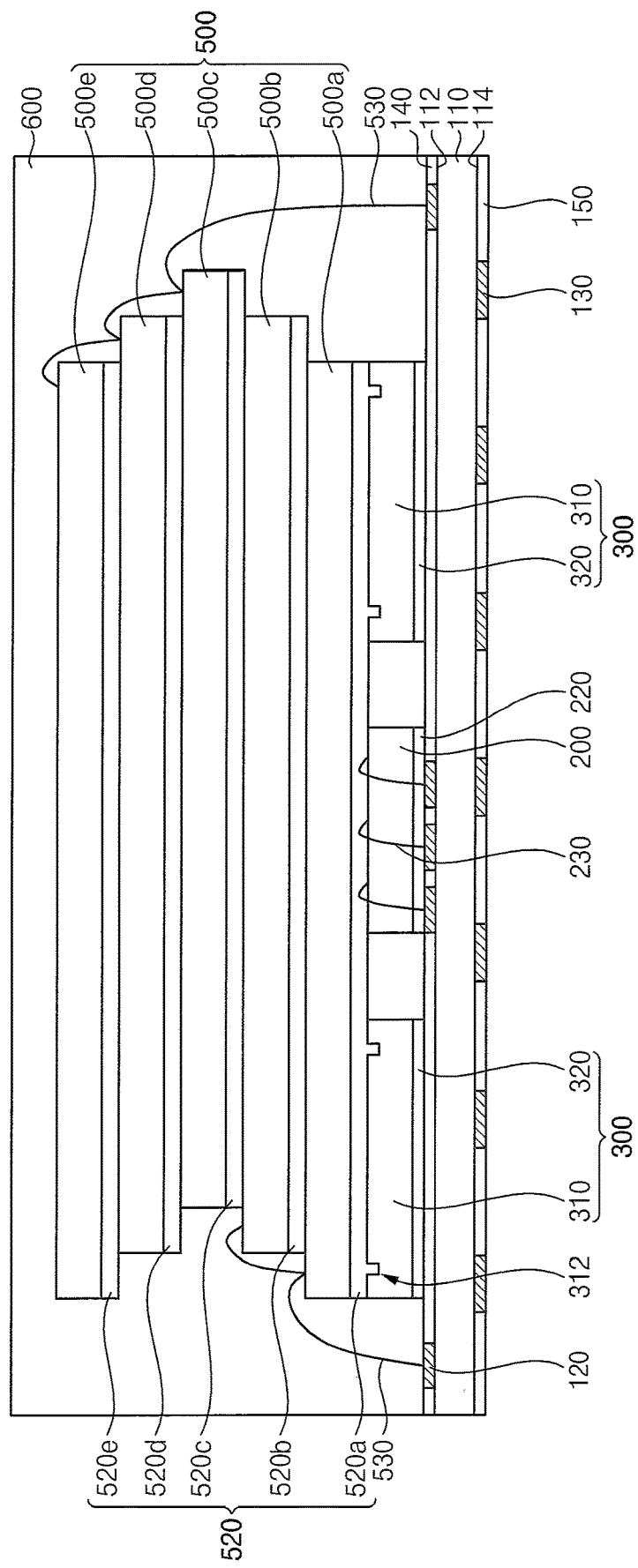

Referring to FIG. 16, a sealing member 600 may be formed on the upper surface 112 of the package substrate 110 to cover the first semiconductor chip 200, the spacer chips 310 and the second semiconductor chips 500. The sealing member 600 may include an epoxy mold compound (EMC).

Then, external connection members 700 such as solder balls may be formed on external connection pads 130 in the lower surface 114 of the package substrate 110 to complete the semiconductor package 100 of FIG. 1.

As mentioned above, the groove pattern 312 may be formed in the upper surface 311a of the spacer chip 310 to extend along one side surface (e.g., S1-S4), and the spacer chip 310 may be attached on the package substrate 110. Then, a die attach process may be performed to attach the second semiconductor chip 500 on the spacer chip 310 using the adhesive film 520a such as a DAF.

In the die attach process, the portion of the DAF having fluidity due to relatively high pressure and temperature may fill the groove pattern 312 formed in the upper surface 311a of the spacer chip 320 so that the portion of the DAF is prevented from flowing out of the spacer chip 310. Thus, productivity and product reliability in the die attach process may be improved.

Figure 17:
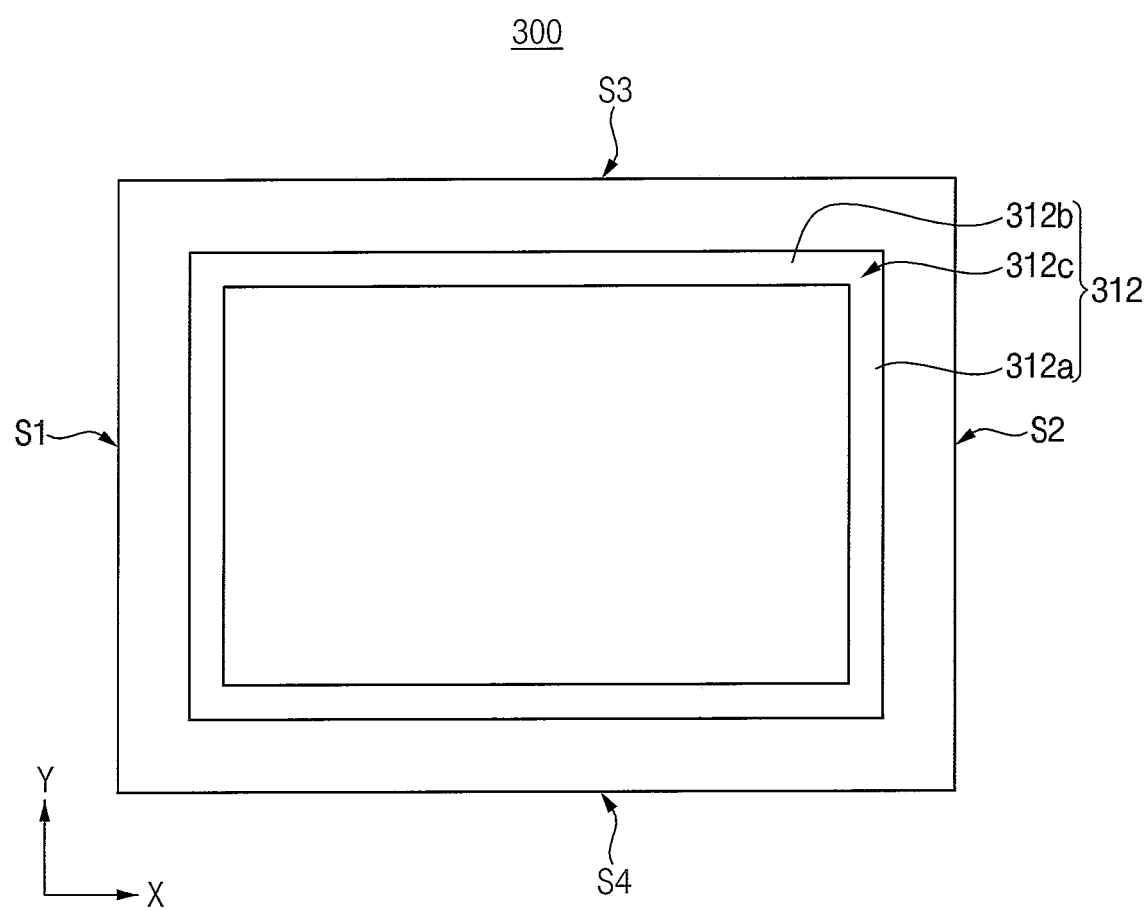

FIG. 17 is a plan view illustrating a spacer chip of a support structure in accordance with example embodiments of the present disclosure.

Referring to FIG. 17, a support structure may include a spacer chip 310 having a groove pattern 312 provided in an upper surface 311a of the spacer chip 310. The groove pattern 312 may include a first extension portion 312a extending in a first direction (Y direction) and a second extension portion 312b extending in a second direction (X direction). Additionally, the groove pattern 312 may further include an intersection portion 312c where the first extension portion 312a and the second extension portion 312b cross each other. The groove pattern 312 may be formed to extend along a peripheral region of the spacer chip 310.

In example embodiments of the present disclosure, the groove pattern 312 may have a closed loop shape extending along the peripheral region of the spacer chip 310. The first extension portion 312a, the second extension portion 312b and the intersection portion 312c may be connected to each other to form the closed loop shape. Both end portions of the first extension portion 312a may not be exposed through third and fourth side surfaces S3 and S4 of the spacer chip 310. Both end portions of the second extension portion 312b may not be exposed through first and second side surfaces S1 and S2 of the spacer chip 310.

Figure 18:
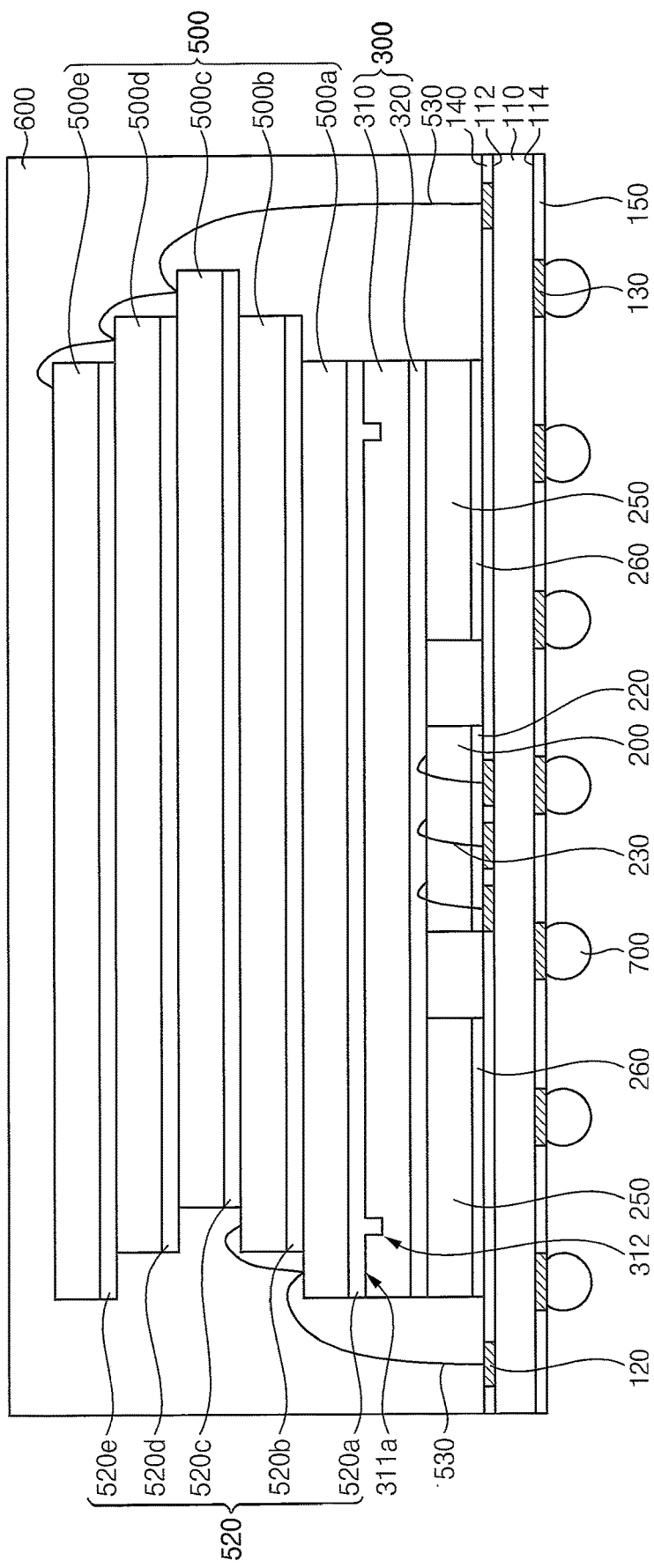

FIG. 18 is a cross-sectional view illustrating a semiconductor package in accordance with example embodiments of the present disclosure. The semiconductor package may be substantially the same as or similar to the semiconductor package described with reference to FIGS. 1 to 4 except for arrangements of first and second support structures. Thus, same reference numerals will be used to refer to the same or like elements and any further repetitive explanation concerning the above elements will be omitted.

Referring to FIG. 18, a semiconductor package 101 may include a package substrate 110, a first semiconductor chip 200, first support structures, a second support structure 300, a plurality of second semiconductor chips 500 and a sealing member 600.

In example embodiments of the present disclosure, the first support structure may include a first spacer chip 250 and an adhesive film 260 attached to a lower surface of the first spacer chip 250. The second support structure 300 may include a second spacer chip 310 having a groove pattern 312 provided in an upper surface 311a and an adhesive film 320 attached to a lower surface of the second spacer chip 310. The second support structure 300 may have a structure substantially the same as the support structure 300 of FIG. 1.

Two first support structures may be disposed in both sides of the first semiconductor chip 200. The second support structure 300 may be stacked on the first semiconductor chip 200 and the first support structures. A planar area of the second spacer chip 310 may be greater than a planar area of the first semiconductor chip 200 or the first spacer chip 250.

The plurality of second semiconductor chips 500 may be stacked on the second support structure 300. A planar area of each of the second semiconductor chips 500a, 500b, 500c, 500d and 500e may be substantially the same as a planar area of the second spacer chip 310. The lowermost second semiconductor chip 510a may be attached on the upper surface 311a of the second spacer chip 310 using an adhesive film 520a such as a DAF by a die attach process. A portion of the DAF having fluidity due to high pressure and temperature in the die attach process may fill the inside of the groove pattern 312 formed in the upper surface 311a of the second spacer chip 310, and thus, the portion of the DAF may be prevented from flowing out of the second spacer chip 310.

Accordingly, the second semiconductor chips 500 may be mounted on the package substrate 110 to be supported on the two first support structures and the second support structure 300.

Figure 19:
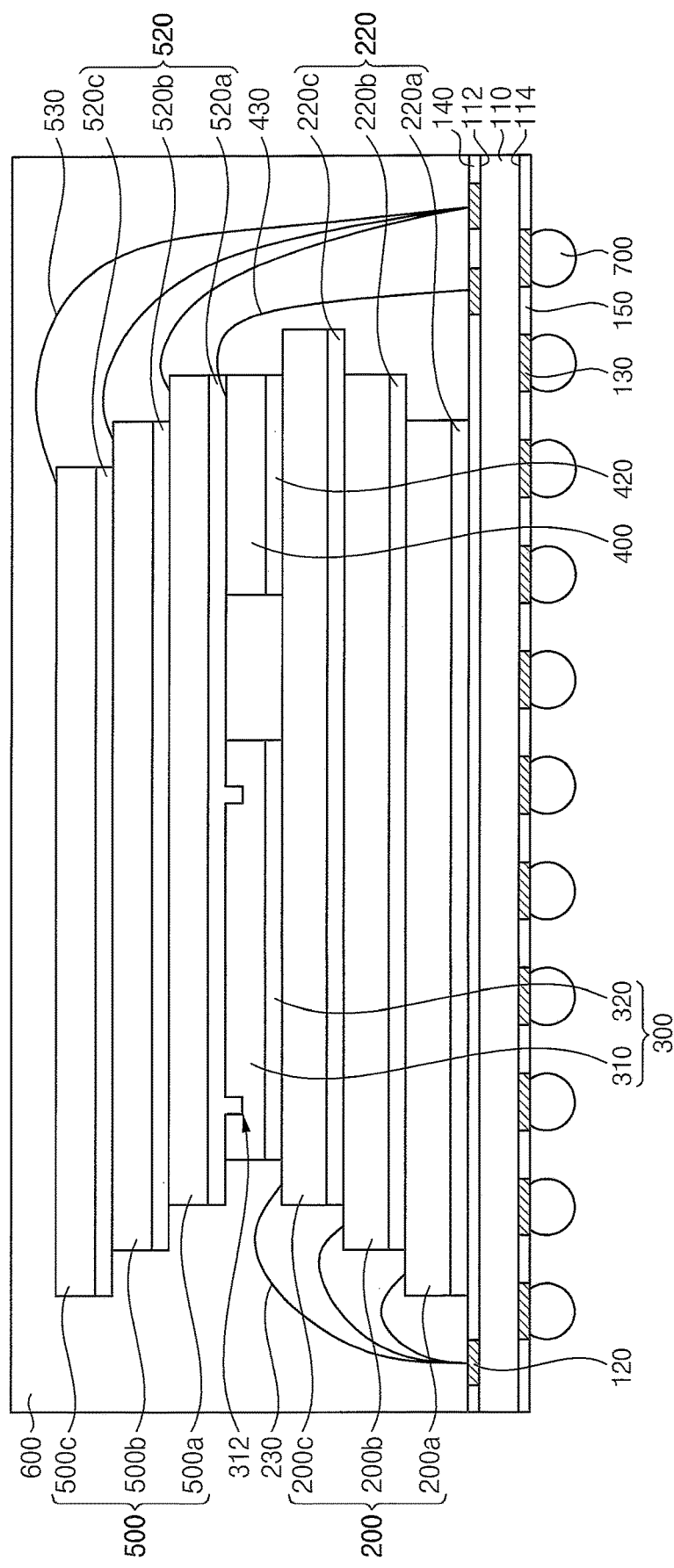

FIG. 19 is a cross-sectional view illustrating a semiconductor package in accordance with example embodiments of the present disclosure. The semiconductor package may be substantially the same as or similar to the semiconductor package described with reference to FIG. 1 except for configurations of additional first and second semiconductor chips and an arrangement of a support structure. Thus, same reference numerals will be used to refer to the same or like elements and any further repetitive explanation concerning the above elements will be omitted.

Referring to FIG. 19, a semiconductor package 102 may include a package substrate 110, a plurality of first semiconductor chips 200, a support structure 300, a plurality of second semiconductor chips 500, a third semiconductor chip 400 and a sealing member 600.

In example embodiments of the present disclosure, the plurality of first semiconductor chips 200 may be stacked on an upper surface 112 of the package substrate 110. The first semiconductor chips 200a, 200b and 200c may be attached on the package substrate 100 using adhesive films 220a, 220b and 220c. The first semiconductor chips 200a, 200b and 200c may be electrically connected to the package substrate 110 by first conductive connecting members 230.

The first conductive connection member 230 may electrically connect a chip pad of the first semiconductor chip 200 to a substrate pad 120 of the package substrate 110.

In example embodiments of the present disclosure, the support structure 300 and the third semiconductor chip 400 may be stacked on the uppermost first semiconductor chip 200c of the first semiconductor chips 200 to be spaced apart from each other. The support structure 300 may include a spacer chip 310 and an adhesive film 320 attached to a lower surface of the spacer chip 310. For example, the adhesive film 320 may include a die attach film (DAF). The spacer chip 310 may be attached on the uppermost first semiconductor chip 200c using the adhesive film 320 by a die attach process. Upper surfaces of the third semiconductor chip 400 and the spacer chip 310 may be substantially coplanar with each other.

The spacer chip 310 attached on the uppermost layer of the first semiconductor chip 200c may have a groove pattern 312 provided in an upper surface thereof to have a predetermined depth and a predetermined width. The groove pattern 312 may extend along a peripheral region of the spacer chip 310.

The plurality of second semiconductor chips 500 may be stacked on the support structure 300 and the second semiconductor chip 400. The second semiconductor chips 500 may be mounted on the uppermost semiconductor chip 200c to be supported by the support structure 300. The second semiconductor chips 500a, 500b and 500c may be attached on the support structure 300 using adhesive films 520a, 520b and 520c such as DAF.

The lowermost second semiconductor chip 500a may be attached on the upper surface of the spacer chip 310 using the adhesive film 520a by a die attach process. A portion of the DAF having fluidity due to high pressure and temperature in the die attach process may fill the inside of the groove pattern 312 formed in the upper surface of the spacer chip 310, and thus, the portion of the DAF may be prevented from flowing out of the spacer chip 310 to the outside.

The sealing member 600 may be formed on the package substrate 110 to protect the first semiconductor chips 200, the support structure 300, the third semiconductor chip 400 and the second semiconductor chips 500 from the outside.

Figure 20:
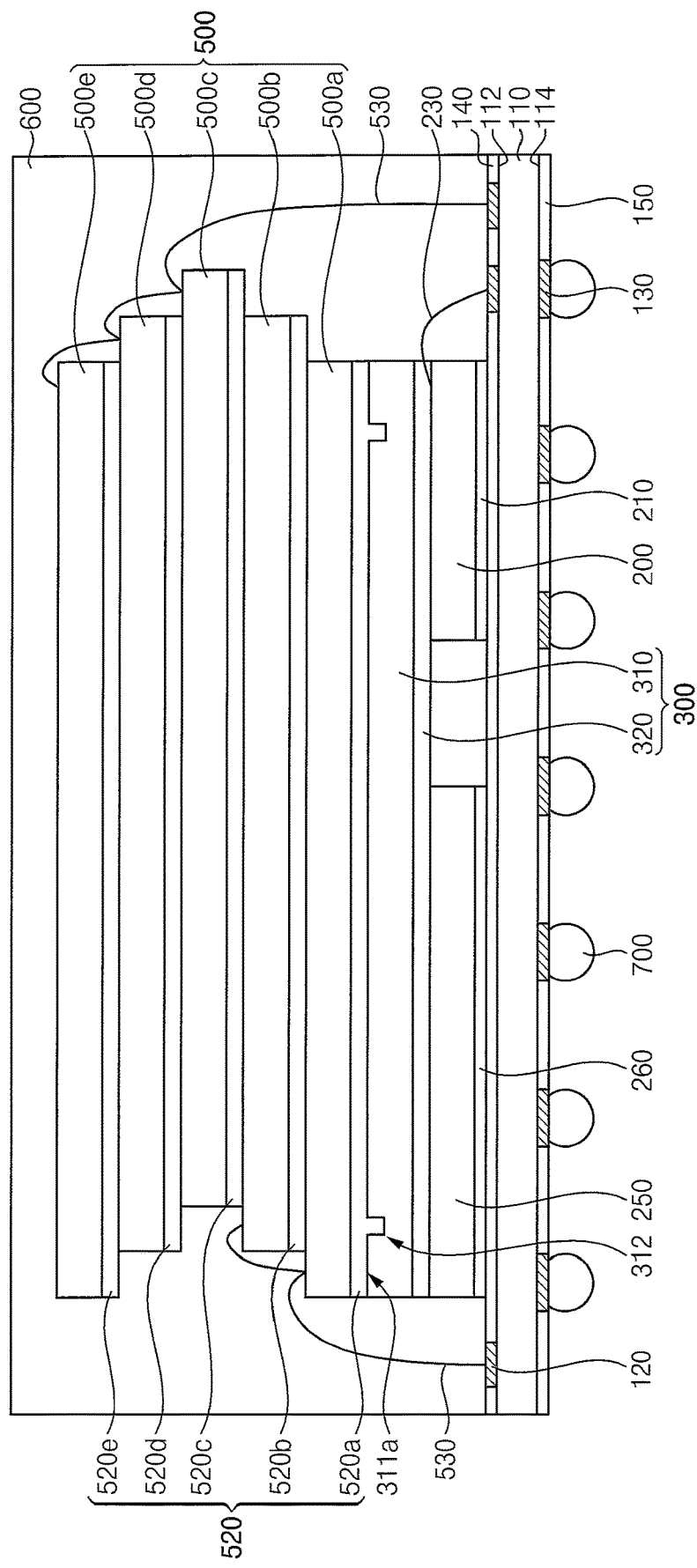

FIG. 20 is a cross-sectional view illustrating a semiconductor package in accordance with example embodiments of the present disclosure. The semiconductor package may be substantially the same as or similar to the semiconductor package described with reference to FIGS. 1 to 4 except for arrangements of first and second support structures. Thus, same reference numerals will be used to refer to the same or like elements and any further repetitive explanation concerning the above elements will be omitted.

Referring to FIG. 20, a semiconductor package 103 may include a package substrate 110, a first semiconductor chip 200, a first support structure, a second support structure 300, a plurality of second semiconductor chips 500 and a sealing member 600.

In example embodiments of the present disclosure, the first support structure may include a first spacer chip 250 and an adhesive film 260 attached to a lower surface of the first spacer chip 250. The second support structure 300 may include a second spacer chip 310 having a groove pattern 312 provided in an upper surface 311a thereof and an adhesive film 320 attached to a lower surface of the second spacer chip 310. The second support structure 300 may have a structure substantially the same as the support structure of FIG. 1.

The first support structure may be disposed on the package substrate 110 to be spaced apart from the first semiconductor chip 200. The second support structure 300 may be stacked on the first semiconductor chip 200 and the first support structure. A planar area of the second spacer chip 310 may be greater than a planar area of the first semiconductor chip 200 or the first spacer chip 250.

The plurality of second semiconductor chips 500 may be stacked on the second support structure 300. A planar area of each of the second semiconductor chips 500a, 500b, 500c, 500d and 500e may be substantially the same as a planar area of the second spacer chip 310. The lowermost second semiconductor chip 510a may be attached on the upper surface 311a of the second spacer chip 310 using an adhesive film 520a such as a DAF by a die attach process. A portion of the DAF having fluidity due to high pressure and temperature in the die attach process may fill the inside of the groove pattern 312 formed in the upper surface of the spacer chip 310, and thus, the portion of the DAF may be prevented from flowing out of the spacer chip 310 to the outside.

Accordingly, the second semiconductor chips 500 may be mounted on the package substrate 110 to be supported by the two first support structures and one second support structure 300.

The semiconductor package according to an embodiment of the present disclosure (e.g., semiconductor packages 100-103) may include semiconductor devices such as logic devices or memory devices. The semiconductor package according to an embodiment of the present disclosure (e.g., semiconductor packages 100-103) may include logic devices such as central processing units (CPUs), main processing units (MPUs), or application processors (APs), or the like, and volatile memory devices such as DRAM devices, high bandwidth memory (HBM) devices, or non-volatile memory devices such as flash memory devices, phase-change random access memory (PRAM) devices, magnetoresistive random access memory (MRAM) devices, resistive random access memory (ReRAM) devices, or the like.

Although example embodiments of the present disclosure have been described, those skilled in the art will readily appreciate that many modifications are possible in the disclosed embodiments without materially departing from scope of the present invention. Accordingly, all such modifications are intended to be included within the scope of example embodiments as set forth in the claims.

What is claimed is:

1. A semiconductor package, comprising:
   a package substrate;
   a spacer chip attached on a surface of the package substrate, the spacer chip having a groove pattern in a surface of the spacer chip;
   at least one semiconductor chip mounted on the package substrate, the at least one semiconductor chip being attached on the surface of the spacer chip via an adhesive film; and
   a sealing member on the surface of the package substrate, the sealing member covering the spacer chip and the at least one semiconductor chip, wherein the groove pattern includes a first groove extending in a first direction and a second groove extending in a second direction that intersects with the first direction.

2. The semiconductor package of claim 1, wherein the groove pattern extends along a peripheral region of the spacer chip.

3. The semiconductor package of claim 1, wherein the groove pattern includes two first grooves extending parallel with each other and two second grooves extending parallel with each other.

4. The semiconductor package of claim 3, wherein one of the two first grooves is arranged adjacent to a first side surface of the spacer chip and the other of the two first grooves is arranged adjacent to a second side surface of the spacer chip opposite the first side surface, and wherein one of the two second grooves is arranged adjacent to a third side surface of the spacer chip adjacent to the first side surface of the spacer chip and the other of the two second grooves is arranged adjacent to a fourth side surface of the spacer chip opposite the third side surface.

5. The semiconductor package of claim 1, wherein a depth of the groove pattern is within a range of 30% to 70% of a thickness of the spacer chip.

6. The semiconductor package of claim 1, wherein the adhesive film includes a die attach film.

7. The semiconductor package of claim 1, wherein the spacer chip has a thickness of about 50 μm to about 800 μm.

8. The semiconductor package of claim 1, wherein the spacer chip includes a silicon material.

9. A semiconductor package, comprising:
a package substrate having an upper surface and a lower surface opposite to each other, the package substrate having a plurality of substrate pads in the upper surface;
a first spacer chip arranged on the upper surface of the package substrate, the first spacer chip having a groove pattern in an upper surface of the first spacer chip;
at least one first semiconductor chip attached on the upper surface of the first spacer chip via an adhesive film;
first conductive connection members electrically connecting chip pads of the first semiconductor chip and the substrate pads; and
a sealing member on the upper surface of the package substrate, the sealing member covering the first spacer chip and the first semiconductor chip,
wherein a portion of the adhesive film is disposed in the groove pattern of the first spacer chip, and wherein the groove pattern includes a first groove extending in a first direction and a second groove extending in a second direction that intersects with the first direction.

10. The semiconductor package of claim 9, further comprising:
a second spacer chip arranged between the package substrate and the first spacer chip.

11. The semiconductor package of claim 10, wherein a planar area of the first spacer chip is greater than a planar area of the second spacer chip.

12. The semiconductor package of claim 10, wherein the second spacer chip has no recess pattern in an upper surface thereof.

13. The semiconductor package of claim 9, wherein the groove pattern extends along a peripheral region of the first spacer chip.

14. The semiconductor package of claim 9, wherein the adhesive film includes a die attach film.

15. The semiconductor package of claim 9, wherein the spacer chip has a thickness of about 50 μm to about 800 μm.

16. A semiconductor package, comprising:
a package substrate;
a first semiconductor chip attached on a surface of the package substrate and electrically connected to the package substrate by first conductive connection members;
a first spacer chip arranged on the surface of the package substrate and spaced apart from the first semiconductor chip;
a second spacer chip arranged on the first semiconductor chip and the first spacer chip, the second spacer chip having a groove pattern in an upper surface of the second spacer chip;
a second semiconductor chip attached on the upper surface of the second spacer chip via an adhesive film, the second semiconductor chip being electrically connected to the package substrate by second conductive connection members; and
a sealing member on the surface of the package substrate, the sealing member covering the first semiconductor chip, the first spacer chip, the second spacer chip and the second semiconductor chip,
wherein a portion of the adhesive film is disposed in the groove pattern of the second spacer chip.

* * * * *